United States Patent
Park (10) Patent No.: US 7,411,173 B2
(45) Date of Patent: Aug. 12, 2008

(54) IMAGE SENSOR AND METHOD OF MANUFACTURING THE SAME

(75) Inventor: Byung-Jun Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 79 days.

(21) Appl. No.: 11/447,411

(22) Filed: Jun. 6, 2006

(65) Prior Publication Data
US 2007/0075221 A1    Apr. 5, 2007

(30) Foreign Application Priority Data
Oct. 1, 2005     (KR)  .................. 10-2005-0092667

(51) Int. Cl.
*H01L 31/00*     (2006.01)
(52) U.S. Cl. .................. 250/214.1; 257/292; 438/57
(58) Field of Classification Search .............. 250/208.1, 250/214.1; 257/290–293; 438/57
See application file for complete search history.

(56) References Cited

U.S. PATENT DOCUMENTS

| | | | |
|---|---|---|---|
| 6,423,993 B1 * | 7/2002 | Suzuki et al. | 257/292 |
| 6,661,045 B2 * | 12/2003 | Ishiwata | 257/290 |
| 7,187,023 B2 * | 3/2007 | Yoshihara | 257/292 |
| 7,232,697 B2 * | 6/2007 | Hsu et al. | 438/48 |
| 2005/0263804 A1 * | 12/2005 | Yoshihara | 257/291 |
| 2006/0027888 A1 * | 2/2006 | Yoshihara | 257/440 |
| 2007/0092985 A1 * | 4/2007 | Yoshihara | 438/57 |
| 2007/0120160 A1 * | 5/2007 | Hsu et al. | 257/292 |
| 2007/0145444 A1 * | 6/2007 | Lim | 257/292 |

FOREIGN PATENT DOCUMENTS

| | | |
|---|---|---|
| JP | 11312731 | 9/1999 |
| KR | 20030056071 | 7/2003 |
| KR | 0038849 | 4/2005 |
| KR | 20050041057 | 5/2005 |

OTHER PUBLICATIONS

English Abstract of Publication No. 1020050038849.
TH Hsu, et al. "Light Guide for Pixel Crosstalk Improvement in Deep Submicron CMOS Image Sensor," pp. 22-24, IEEE Electron Device Letters, vol. 25, No. 1, Jan. 2004.
English Abstract of Publication No. 11-312731.
English Abstract of Publication No. 2003-0056071.
English Abstract of Publication No. 10-2005-0041057.

* cited by examiner

*Primary Examiner*—John R Lee
(74) *Attorney, Agent, or Firm*—F. Chau & Associates, LLC.

(57) ABSTRACT

An image sensor is provided. The image sensor includes a photodiode disposed in a semiconductor substrate and a first device isolating layer formed having an impurity with a conductivity type in the semiconductor substrate adjacent to the photodiode. The image sensor further includes a second device isolating layer composed of an insulating layer that covers the first device isolating layer. In addition, the image sensor further includes an interlayer insulating layer formed on the second device isolating layer and which is composed of a material with refractivity greater than that of the second device isolating layer.

22 Claims, 6 Drawing Sheets

IMAGE SENSOR AND METHOD OF MANUFACTURING THE SAME

CROSS-REFERENCE TO RELATED PATENT APPLICATION

This application claims the benefit of Korean Patent Application No. 10-2005-0092667, file on Oct. 1, 2005, in the Korean Intellectual Property Office, the disclosure of which is hereby incorporated by reference herein in its entirety.

BACKGROUND OF THE INVENTION

1. Field of the Invention

The present invention relates to a semiconductor device and a method of manufacturing the same, and more particularly, to an image sensor for converting optical signals into electrical signals, and a method of manufacturing the same.

2. Description of the Related Art

Image sensors are semiconductor devices that generally convert optical signals into electrical signals. Examples of image sensors include complementary Metal Oxide Semiconductor (CMOS) image sensors (CIS) and Charge Coupled Device (CCD) image sensors. CIS and CCD image sensors share some similarities with one another with respect to both structure and function. For instance, light incident to two-dimensionally arranged photodiodes in both the CIS and CCD image sensors is converted to a signal charge (electrons), and is then consecutively read out as a signal voltage according to a temporal axis. However, the CIS image sensor differs from the CCD sensor with respect to converting a signal charge into a signal voltage, as well as with transferring the signal to an output port. For example, a CIS image sensor converts a signal charge to a signal voltage in a plurality of unit pixels, and outputs a signal from a signal line by a switching operation. A CCD, however, transfers a signal charge in order of a vertical register and a horizontal register, and converts it into the signal voltage just before an output port.

Additionally, the CCD is partitioned into a pixel region including a photodiode that converts incident light into a charge enabling image processing, and a peripheral circuit region that controls pixels. In the pixel region, an active region is defined by a device isolating layer, and a photodiode and a plurality of gates are formed on the active region. In the peripheral circuit region, elements that control the pixels are formed on an active region defined by the device isolating layer.

Figure 1:
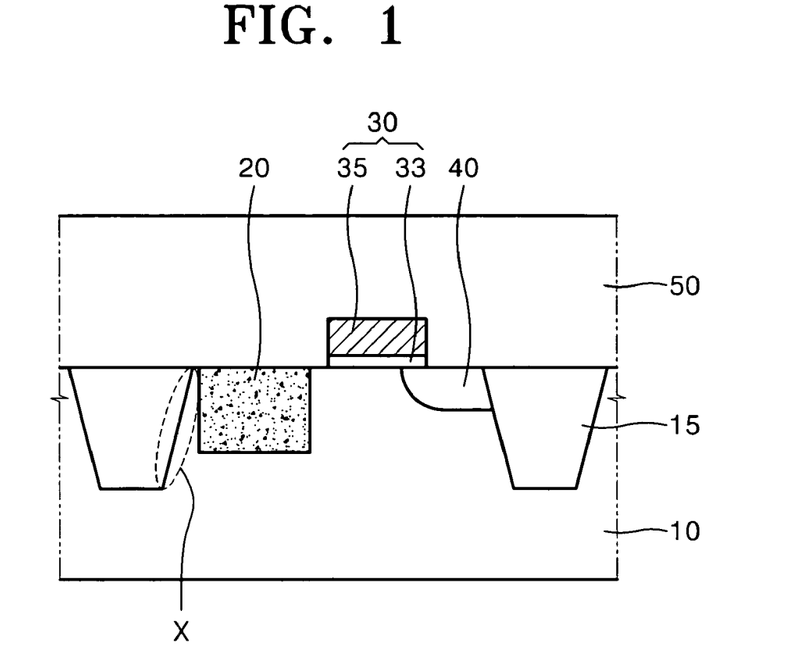
FIG. 1 is a cross-sectional view of a conventional image sensor.

FIG. 1 is a cross-sectional view illustrating a pixel of a conventional image sensor.

Referring to FIG. 1, a device isolating layer 15 having a Shallow Trench Insulator (STI) structure is formed on an n-type semiconductor substrate 10. A photodiode 20, a transfer gate 30, and a floating diffusion region 40 are disposed in an active region defined by the device isolating layer 15. The transfer gate 30 includes a conductive layer 35 for a gate and a gate insulating layer 33. The transfer gate 30 transfers optical charges generated from the photodiode 20 to the floating diffusion region 40. An interlayer insulating layer 50 is formed on a pixel region including the photodiode 20 and the transfer gate 30. The interlayer insulating layer 50 is typically composed of an oxide.

In the conventional image sensor illustrated in FIG. 1, a phenomenon known as dark current may occur due to crystal defects or dangling bonds being generated on the surface of the semiconductor substrate 10 or a bordering surface between the device isolating layer 15 and the semiconductor substrate 10. A dark current is a current which is produced even when no light is supplied to a photodiode of an image sensor. The above-mentioned dark current may cause the picture quality of the image sensor to deteriorate.

Moreover, with the above-mentioned conventional image sensor, the dark current may also flow to another photodiode instead of the photodiode 20 in the active region defined by the device isolating layer 15, so that the corresponding photodiode 20 may not form an accurate signal which is based upon the actual amount of light received by the micro-lens of the photodiode 20 of the image sensor. Furthermore, crosstalk may occur between neighboring photodiodes of an image sensor, which in turn may impede the formation of a desired image.

Thus, there is a need for an image sensor that prevents dark current and crosstalk, as well as for a method of forming the same.

SUMMARY OF THE INVENTION

According to an exemplary embodiment of the present invention, an image sensor is provided. The image sensor includes a photodiode disposed in a semiconductor substrate and a first device isolating layer formed having an impurity with a conductivity type in the semiconductor substrate adjacent to the photodiode. The image sensor further includes a second device isolating layer composed of an insulating layer which covers the first device isolating layer. In addition, the image sensor further includes an interlayer insulating layer formed on the second device isolating layer and which is composed of a material with refractivity greater than that of the second device isolating layer.

Here, the first device isolating layer may be formed by ion implanting an impurity with a conductivity type opposite to that of the impurity constituting the photodiode. For example, an N-type photodiode may be formed on a P-type semiconductor substrate, and the first device isolating layer composed of a P-type impurity at a density higher than that of the P-type impurity forming the semiconductor substrate. By doing so, the photodiode is electrically isolated from another photodiode.

The depth of the first device isolating layer may be varied according to an ion implantation quantity, ion implantation time, or annealing after the ion implantation. It is deep enough to device isolation. Because the first device isolating layer is formed by ion implantation, crystal defects or dangling bonds occurring between a contacting surface of the first device layer and the semiconductor substrate may be prevented. Therefore, dark current and resulting crosstalk between the contacting surface of the first device layer and the semiconductor substrate may be prevented.

The second device isolating layer may be composed of an insulating layer, and which covers the first device isolating layer, thereby electrically isolating the photodiode from another photodiode.

The interlayer insulating layer may include a material with a refractivity greater than that of the material constituting the second device isolating layer. Thus, the refractivity difference between the interlayer insulating layer and the second device isolating layer prevents a photodiode formed on a region exclusive of an active region defined by the device isolating layer to receive oblique light with a predetermined incident angle. In other words, oblique light with the predetermined incident angle passes through the interlayer insulating layer, and is reflected by the second device isolating layer to be concentrated on the corresponding photodiode. When the second device isolating layer is composed of thermal oxide, high density plasma (HDP) oxide, and silicon dioxide ($SiO_2$), the interlayer insulating layer may be composed of silicon oxynitride (SiON) with refractivity greater than refractivities of thermal oxide and HDP oxide. The SiON layer may be formed by, for example, plasma enhanced chemical vapor deposition (PE-CVD) using silane ($SiH_4$) and nitrogen ($N_2$) as source gas. The refractivity of the SiON layer may be adjusted in accordance with, for example, the content of nitrogen or deposition thickness. By controlling the refractivity, the interlayer insulating layer is formed to concentrate the oblique light with the predetermined incident angle onto the photodiode.

To prevent dark current caused by dangling bonds on the surface of the semiconductor substrate, the image sensor further includes a first hole accumulation region formed on the first device isolating layer contacting the second device isolating layer. Also, the image sensor further includes a second hole accumulation region formed on the semiconductor substrate over the photodiode. The hole accumulation regions may be formed by ion implanting a P-type impurity. For example, when the first device isolating layer is formed by implanting the P-type impurity at a high density in the P-type semiconductor substrate, the first hole accumulation region may be formed by ion implanting the P-type impurity at a density higher than that of the P-type impurity constituting the first device isolating layer to a surface of the first device isolating layer. The second hole accumulation region may be formed by ion implanting the P-type impurity at a density higher than that of the P-type impurity constituting the semiconductor substrate to the surface of the semiconductor substrate over the photodiode.

According to another exemplary embodiment of the present invention, an image sensor is provided. The image sensor includes a pixel region and a peripheral circuit region defined on a semiconductor substrate. Moreover, the pixel region includes a first device isolating layer having an impurity with a conductivity type in the semiconductor substrate adjacent to a photodiode, and a second device isolating layer composed of an insulating layer that covers the first device isolating layer. Also, the peripheral circuit region of the image sensor includes a third device isolating layer having a shallow trench insulator (STI) structure.

The pixel region electrically isolates the photodiode and the transistor using the first device isolating layer formed by ion implantation and the second device isolating layer that covers the first device isolating layer. The first device isolating layer is formed by ion implanting an impurity with a conductivity type opposite to those of the impurity constituting the photodiode and the impurity constituting source/drain for forming the transistor. Therefore, the photodiode and the transistor are isolated, thereby preventing the occurrence of dark current and resulting crosstalk produced on the bordering surface of the semiconductor substrate.

The peripheral circuit region includes a third device isolating layer having an STI structure to provide device isolation. The third device isolating layer is formed by etching the semiconductor substrate to a predetermined depth to form a shallow trench, and filling the inside of the trench with an insulating layer, e.g., an oxide layer.

According to still another exemplary embodiment of the present invention, a method of manufacturing an image sensor is provided. The method includes forming a first mask and a second mask on a semiconductor substrate. Then, an impurity with a conductivity type is ion implanted in the semiconductor substrate to form the first device isolating layer, using the second mask as an ion implantation mask. A second device isolating layer is then formed that covers the first device isolating layer using the first mask. After forming the second device isolating layer, a photodiode, a plurality of gates, and an impurity implanting region are formed on an active region defined by the first device isolating layer. Thereafter, an interlayer insulating layer is formed on the semiconductor substrate where the photodiode, the plurality of gates, and impurity implanting region are formed. The photodiode is formed having an impurity with a conductivity type opposite to the impurity with the conductivity type constituting the first device isolating layer.

The first device isolating layer may be formed by ion implanting the impurity with a conductivity type opposite to that of the impurity constituting the photodiode that will be formed later.

The method may further include forming a first hole accumulation region by ion implanting the P-type impurity via self-alignment, using the second mask remaining after forming the first device isolating layer.

The second device isolating layer may be formed to be over the first mask in view of a process margin. In this case, planarization, e.g., chemical mechanical polishing (CMP), may be performed to allow the second device isolating layer to be as high as the first mask. The second device isolating layer may be formed by forming a thin thermal oxide layer to repair damage caused by stress, and depositing a HDP oxide layer.

The method may further include forming the photodiode and the transistor in an active region defined by the first device isolating layer and the second device isolating layer, and ion implanting the P-type impurity in the semiconductor substrate on the photodiode to form the second hole accumulation region.

The interlayer insulating layer may be formed by depositing an insulating layer on the semiconductor substrate where the photodiode, the plurality of gates, and the impurity implanting region. For example, when the second device isolating layer is composed of an oxide layer, the interlayer insulating layer may be composed of SiON. The SiON layer may be formed by PE-CVD, using $SiH_4$ and $N_2$ as source gas.

According to yet another exemplary embodiment of the present invention, a method of manufacturing an image sensor is provided. The method includes ion implanting an impurity on a semiconductor substrate for a pixel region to form a first device isolating layer, using an ion implantation mask. The method further includes forming a second device isolating layer that covers the first device isolating layer, using a hard mask and forming a trench in a peripheral circuit region of the semiconductor substrate. After the trench is formed, a third device isolating layer of the peripheral circuit region is formed by filling the trench with an insulating layer.

BRIEF DESCRIPTION OF THE DRAWINGS

Exemplary embodiments of the present invention can be understood in more detail from the following description taken in conjunction with the attached drawings in which.

DETAILED DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein. In the drawings, the thicknesses of layers and regions are exaggerated for clarity. Like reference numerals in the drawings denote like elements.

Figure 2:
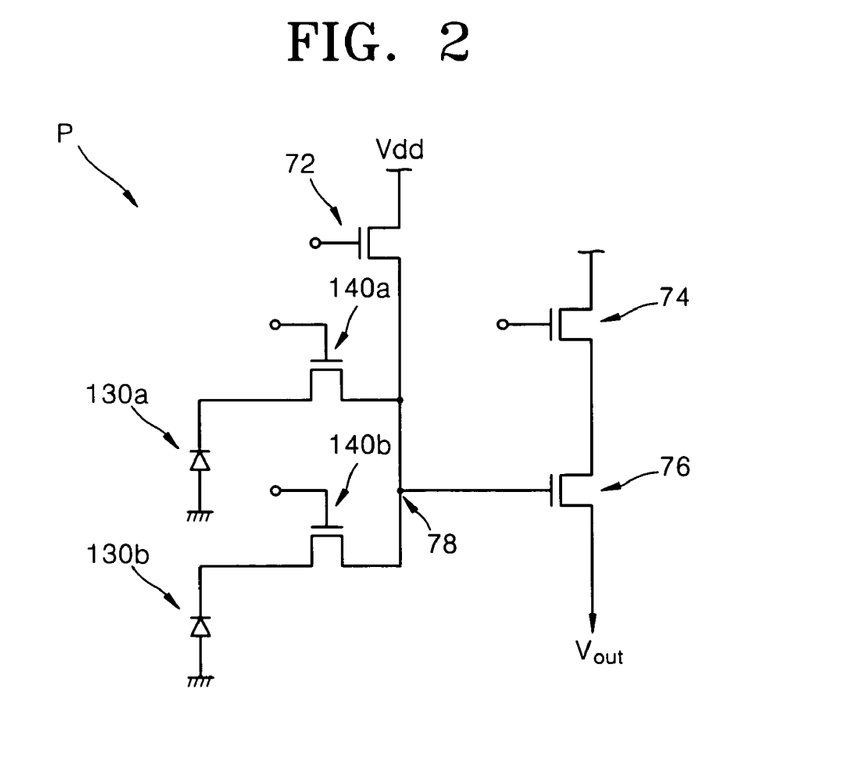
FIG. 2 is an equivalent circuit diagram of a unit pixel of a CMOS image sensor (CIS) according to an exemplary embodiment of the present invention.

FIG. 2 is a circuit diagram of a unit pixel of a Complementary Metal Oxide Semiconductor Image Sensor (CIS) according to an exemplary embodiment of the present invention.

Referring to FIG. 2, the unit pixel includes two photodiodes 130a and 130b, and two transfer transistors 140a and 140b that commonly share a reset transistor 72, a select transistor 74 and a drive transistor 76. The above design of this exemplary embodiment is for attaining high integration while at the same time, minimizing the CIS. Thus, with the image sensor of this exemplary embodiment, the unit pixel may include at least two photodiodes and the CIS may be able to sense a quantity of light across a wide range. The unit pixel includes the photodiodes 130a and 130b that receive light to generate an optical charge and transfer transistors 140a and 140b which transfer the signal charge generated from the photodiodes 130a and 130b, respectively, to a floating diffusion region 78. Additionally, the reset transistor 72 periodically resets the charge stored in the floating diffusion region 78. The drive transistor 76 acts as a source buffer amplifier, and buffers a signal resulting from the charge stored in the floating diffusion region 78. Moreover, the select transistor 74 is also included in the unit pixel for switching to and addressing the select the unit pixel.

For example, the unit pixel may be driven as follows. When ligh incident to the photodiodes 130a and 130b which are light receiving elements, the photodiodes 130a and 130b generate electron-hole pairs (EHP) in proportion to the amount of light which is sensed. Potentials of source nodes of the transfer transistors 140a and 140b corresponding to the respective photodiodes 130a and 130b are varied in proportion to a quantity of the generated signal charges. The signal charge generated from the photodiodes 130a and 130b is trapped from the photodiodes 130a and 130b by gate barriers of the transfer transistors 140a and 140b.

When the transfer transistors 140a and 140b are supplied with a voltage similar to a reset voltage, and then turned on, the signal charge stored in the photodiodes 130a and 130b is transferred to the floating diffusion region 78. The two transfer transistors 140a and 140b commonly share the floating diffusion region 78. The potential of the floating diffusion region 78 is varied in proportion to the amount of the transferred signal charge. The charge of the floating diffusion region 78 is supplied to the drive transistor 76 via a contact and an interconnect that mutually connects the contacts, thereby controlling current flowing through the select transistor 74 that is turned on by a selection signal supplied to the select transistor 74. Therefore, a gate bias of the select transistor 74 is changed. The potential of the floating diffusion region 78 is changed as described above, so that a source potential of the select transistor 74 is varied. The current flowing through the select transistor 74 corresponds to a new output voltage at an output port Vout of the pixel.

Thereafter, the reset transistor 72 is turned on again to charge the potential of the floating diffusion region 78 to a Vdd voltage. The foregoing steps are repeated to read out the output signal on the output port Vout.

Figure 3:
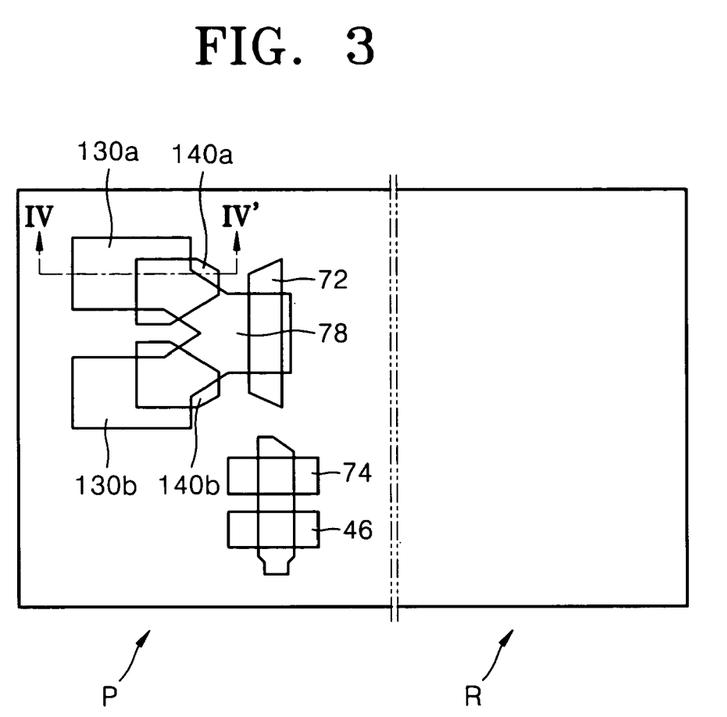
FIG. 3 is a layout of the CIS referred to in FIG. 2 according to an exemplary embodiment of the present invention.

FIG. 3 is a layout of the CIS referred to in FIG. 2 according to an exemplary embodiment of the present invention.

Referring to FIG. 3, the CIS has a pixel region P corresponding to the circuit diagram of FIG. 2 and a peripheral circuit region R.

The active region of the pixel region P is defined by the device isolating layer. The two photodiodes 130a and 130b are arranged in series in the active region. The respective transfer transistors 140a and 140b are disposed in the active region. The floating diffusion region 78 is formed by implanting an impurity to a predetermined region of the active region. Accordingly, the floating diffusion region 78 is shared by the two photodiodes 130a and 130b and the two transfer transistors 140a and 140b. The reset transistor 72 is formed along an extended line of the active region where the floating diffusion region 78 is formed. The drive transistor 76 and the select transistor 74 are formed in the active region. The drive transistor 76 and the select transistor 74 may be formed along an extending line of the active region where the reset transistor 72 is formed. Otherwise, the drive transistor 76 is mutually connected to the floating diffusion region 78 and the select transistor 74 via the contact.

The peripheral circuit region R is formed on the same surface of the semiconductor substrate where the pixel region P is disposed, thereby controlling the elements of the pixel region P.

Figure 4:
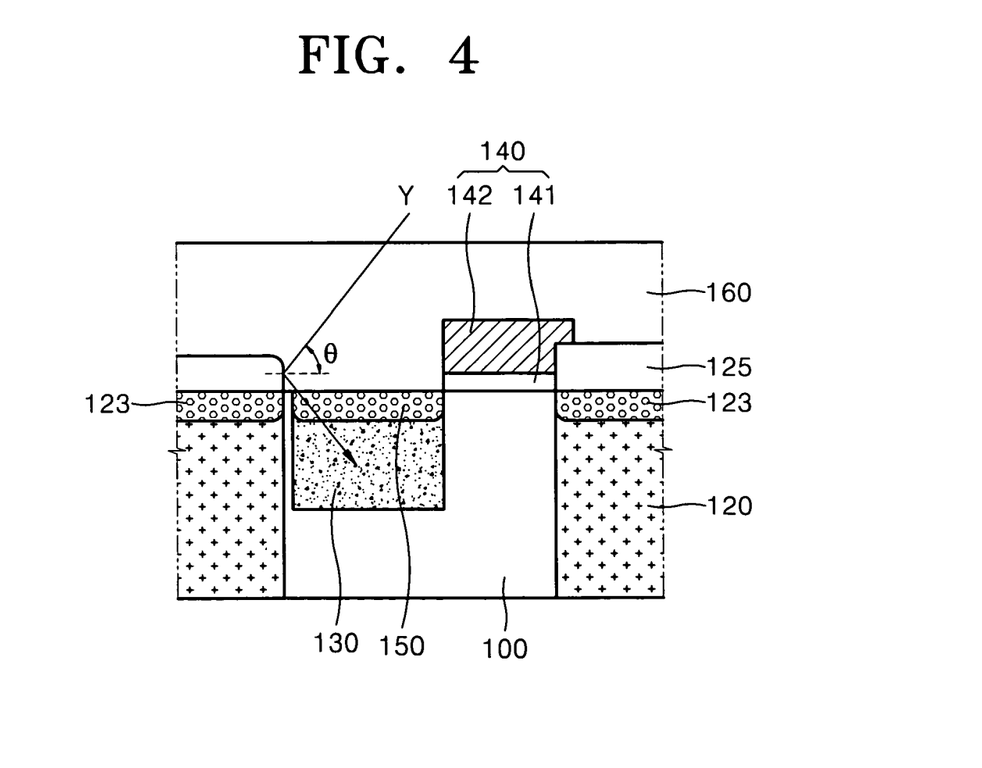
FIG. 4 is a cross-sectional view, taken along a line IV-IV' of the CIS of FIG. 3.

FIG. 4 is a cross-sectional view, taken along a line IV-IV' of the CIS of FIG. 3. Therefore, a photodiode 130 and a transfer transistor gate 140 are disposed on the active region defined by the device isolating layer of the pixel region P.

Referring to FIG. 4, an impurity is implanted in a semiconductor substrate 100 to form a first device isolating layer 120. The first device isolating layer 120 is formed by implanting an impurity with a conductivity type opposite to that of the impurity included in the photodiode 130. For example, a P-type impurity having a high density with a conductivity type opposite to that of an N-type impurity included in the photodiode 130 is implanted to the semiconductor substrate 100, thereby forming the first device isolating layer 120. Using a mask for forming the first device isolating layer 120, the P-type impurity is implanted to form a first hole accumulation region 123. Accordingly, the first hole accumulation region 123 is formed by self-alignment. A second device isolating layer 125 is formed on the first device isolating layer 120 to cover the first device isolating layer 120. The second device isolating layer 125 is composed of an insulating layer, and electrically separates other photodiodes and other transistors together with the first device isolating layer 120. An impurity is ion implanted to the active region defined by the first device isolating layer 120 and the second device isolating layer 125, thereby forming the photodiode 130. Then, the transfer transistor gate 140 is formed on the active region. The transfer transistor gate 140 includes a gate insulating layer pattern 141 and a gate conductive layer pattern 142. The P-type impurity is ion implanted to the semiconductor substrate 100 exposed by the second device isolating layer 125 and the transfer transistor gate 140, thereby forming a second hole accumulation region 150 in the surface of the semiconductor substrate 100 over the photodiode 130. An interlayer insulating layer 160 is formed on the semiconductor substrate 100 having the photodiode 130 and the transfer transistor gate 140.

Dark current caused by dangling bonds and crystal defects can be prevented by forming the first device isolating layer 120 using ion implantation. Also, the dark current produced across the surface of the semiconductor substrate 100 is prevented by forming the first and second hole accumulation regions 123 and 150 using ion implantation of a P-type impurity to the surface of the first device isolating layer 120 or the semiconductor substrate 100 over the photodiode 130.

The interlayer insulating layer 160 includes a material with refractivity greater than that of a material constituting the second device isolating layer 125. By doing so, an oblique light Y with a predetermined incident angle θ is fully reflected when reaching the second device isolating layer 125 after passing through the interlayer insulating layer 160, and then is concentrated onto the photodiode 130.

A refractivity difference of the materials respectively constituting the second device isolating layer 125 and the interlayer insulating layer 160 may be determined by factors such as, for example, the material and thickness of the layers. For example, the second device isolating layer 125 is composed of oxide with a refractivity of about 1.46, and the interlayer insulating layer 160 is composed of silicon oxynitride (SiON) having a thickness of about 3,000 angstroms (Å) and a refractivity of about 1.60. The oxide layer may be formed using thermal oxidation, high density plasma (HDP), or a combination of these methods. The SiON layer may be formed by plasma enhanced chemical vapor deposition (PE-CVD) using silane ($SiH_4$), nitrogen ($N_2$) and oxygen ($O_2$) as source gas. Accordingly, the oblique light Y with the predetermined incident angle θ may be fully reflected, and then concentrated onto the photodiode 130.

FIGS. 5 through 12 are sectional views illustrating a method of manufacturing an image sensor corresponding to the layout shown in FIG. 3 according to an exemplary embodiment of the present invention.

Figure 5:
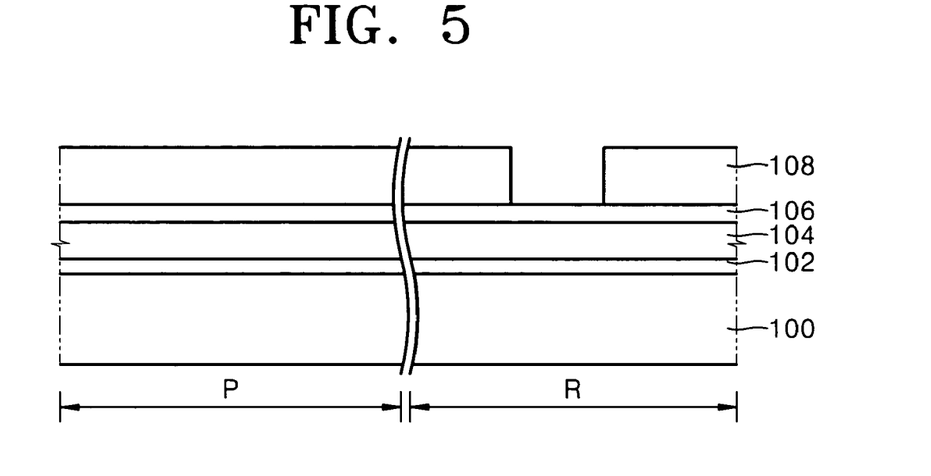
FIGS. 5 through 12 are cross-sectional views illustrating a method of manufacturing an image sensor according to an exemplary embodiment of the present invention.

Referring to FIG. 5, a semiconductor substrate 100 having a pixel region P including a photodiode region and a transistor region, and a peripheral circuit region R including a readout circuit around the pixel region P is prepared. A photoresist pattern 108, for forming a third device isolating layer of the peripheral circuit region R, is formed on the semiconductor substrate 100 having a pad oxide layer 102, a first nitride layer 104, and a first anti-reflecting layer 106. The first nitride layer 104 may be formed to a thickness of about 500 to about 1,000 Å. The first anti-reflecting layer 106, is used to form the photoresist pattern 108 which in turn is used for forming the third device isolating layer via photolithography. The first anti-reflecting layer 106 is formed to a thickness of about 500 to about 1,000 Å.

Figure 6:
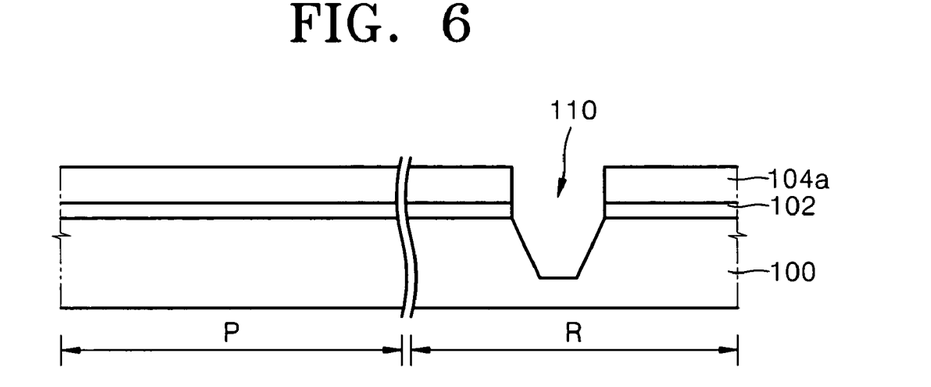

Referring to FIG. 6, the first anti-reflecting layer 106 and the first nitride layer 104 are etched using the photoresist pattern 108, and the photoresist pattern 108 and the first anti-reflecting layer 106 are removed, thereby forming a first nitride layer pattern 104a. The photoresist pattern 108 may be removed by, for example, stripping and ashing. The first anti-reflecting layer 106 may be removed by, for example, wet etching. Using the first nitride layer pattern 104a as an etch mask, the pad oxide layer 102 and the semiconductor substrate 100 are etched to a predetermined depth. Consequently, a trench 110 for device isolation of the peripheral circuit region R is formed.

Figure 7:
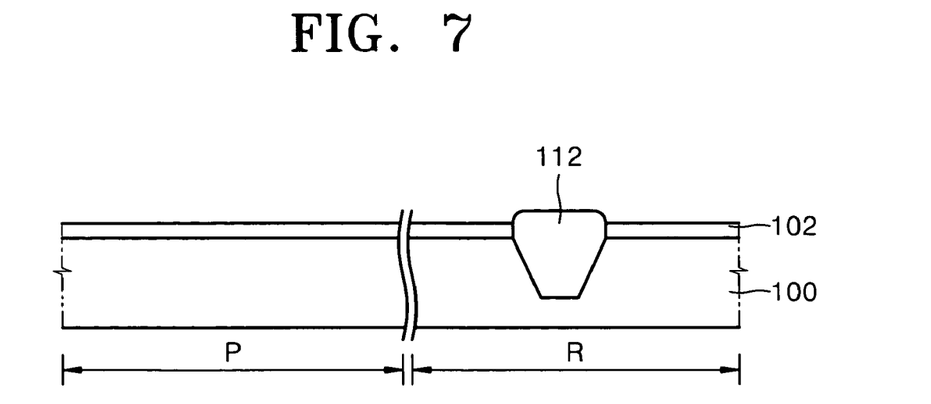

Referring to FIG. 7, a thermal oxide layer is formed along the inside of the trench 110 to alleviate stress which may be caused by etching. Then, a diffusion barrier layer and a buffer oxide layer are formed on the thermal oxide layer. Thereafter, the trench 110 is filled with an insulating layer to form a third device isolating layer 112. Alternatively, at least one of the thermal oxide layer, the diffusion barrier layer, or the buffer oxide layer may be omitted The insulating layer may protrude the first nitride layer pattern (104a of FIG. 6) for a processing margin. In this case, planarization, for example, chemical mechanical polishing (CMP), may be performed until an upper surface of the first nitride layer pattern 104a is exposed, to make the insulating layer level with the first nitride layer pattern 104a. The first nitride layer pattern 104a is wet etched using a phosphoric acid ($H_3PO_4$) strip solution. Thus, the third device isolating layer 112 of the peripheral circuit region R is completed. The third device isolating layer 112 may be formed higher than the semiconductor substrate 100 or the pad oxide layer 102 based upon, for example, on the quantity of the third device isolating layer 112 that may be consumed during subsequent cleaning processes.

Figure 8:
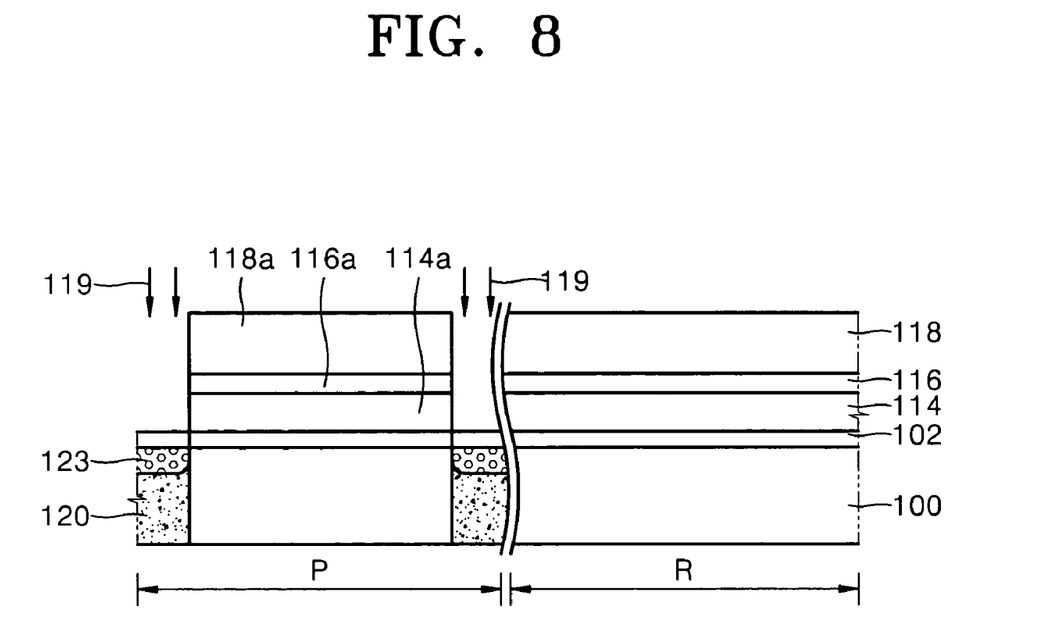

Referring to FIG. 8, a second nitride layer 114, a second anti-reflecting layer 116, and a photoresist layer 118 are formed on the resultant structure. The second anti-reflecting layer 116 is for forming a photoresist pattern 118a to form the first device isolating layer 120 of the pixel region P via photolithography. The photoresist layer 118 is subjected to photolithography that defines the semiconductor substrate 100 where the first device isolating layer 120 of the pixel region P will be formed. In other words, the photoresist pattern 118a is formed to form the first device isolating layer 120 of the pixel region P. Using the photoresist pattern 118a as an etch mask, the second anti-reflecting layer 116 and the second nitride layer 114 are etched to expose the semiconductor substrate 100 or the pad oxide layer 102. An impurity 119 is ion implanted to the exposed semiconductor substrate 100 using the photoresist pattern 118a as an ion implantation mask. The impurity 119 has a conductivity type opposite to an impurity (155 of FIG. 11) included in the photodiode (130 of FIG. 11) that will be formed later. For example, the photodiode (130 of FIG. 11) is formed by ion implanting an N-type impurity (155 of FIG. 11), and the first device isolating layer 120 is formed by ion implanting a P-type impurity 119. The P-type impurity 119 may be, for example boron (B), or boron fluoride ($BF_2$). Using ion implantation, the first device isolating layer 120 of the pixel region P is formed. The first device isolating layer 120 is deep enough to provide device isolation, which may be determined by, for example, the quantity of implanted ions or the thermal diffusion.

The first device isolating layer 120 formed using ion implantation can prevent dark current caused by crystal defects or dangling bonds generated on a bordering surface of the first device isolating layer 120 and the semiconductor substrate 100 from occurring.

The first hole accumulation region 123 may be formed by ion implanting the P-type impurity 119 using the photoresist pattern 118a. The first hole accumulation region 123 is formed by self alignment. It is noted that when photolithography is used, it should be taken into consideration that misalignment of the photoresist pattern or deviation of a critical dimension resulting from respective positions on the semiconductor substrate may occur, which may make it difficult to form a photoresist pattern with a vertical profile. However, as mentioned above, with exemplary embodiments of the present invention, as the first hole accumulation region 123 is formed using self-alignment, difficulties such as mis-alignment and critical dimension deviation resulting from photolithography do not occur. Furthermore, when the first device isolating layer 120 is composed of the P-type impurity 119, the first hole accumulation region 123 may be implanted at a density higher than that of the P-type impurity 119 implanted to the first device isolating layer 120. The first hole accumulation region 123 is formed to prevent generation of dark current, caused by dangling bonds or crystal defects formed on the surface of the first device isolating layer 120, from occurring.

Figure 9:
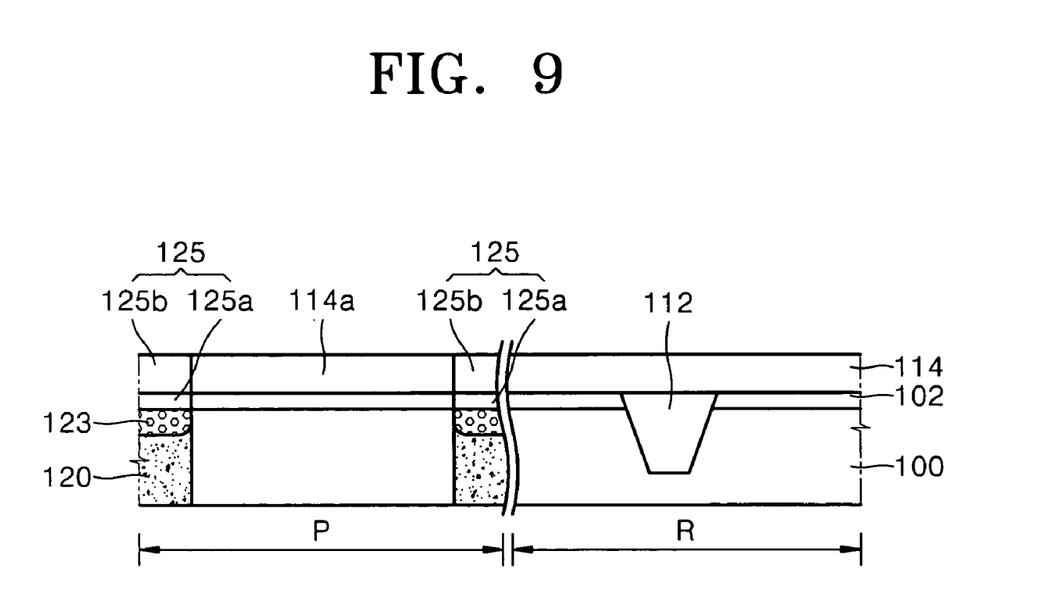

Referring to FIG. 9, the photoresist pattern 118a is removed by ashing and stripping, and the second anti-reflecting layer pattern 116a is removed using $H_3PO_4$ strip solution. The pad oxide layer 102 on the first device isolating layer 120 is removed to expose the semiconductor substrate 100. The exposed semiconductor substrate 100 is thermally oxidized to form a thermal oxide layer 125a to a thickness of about 10 to about 100 Å. The thermal oxide layer 125a is formed to repair the semiconductor substrate 100 damaged from a prior cleaning or a prior etching. An oxide layer, preferably an HDP oxide layer 125b, is formed to a predetermined thickness on the thermal oxide layer 125a by deposition. Accordingly, the second device isolating layer 125 includes the thermal oxide layer 125a and the HDP oxide layer 125b. The second device isolating layer 125 may be formed over the second nitride layer pattern 114a. In this case, the second device isolating layer 125 is planarized, and may be CMP planarized until an upper surface of the second nitride layer pattern 114a is exposed to be level with the second device isolating layer 125.

Figure 10:
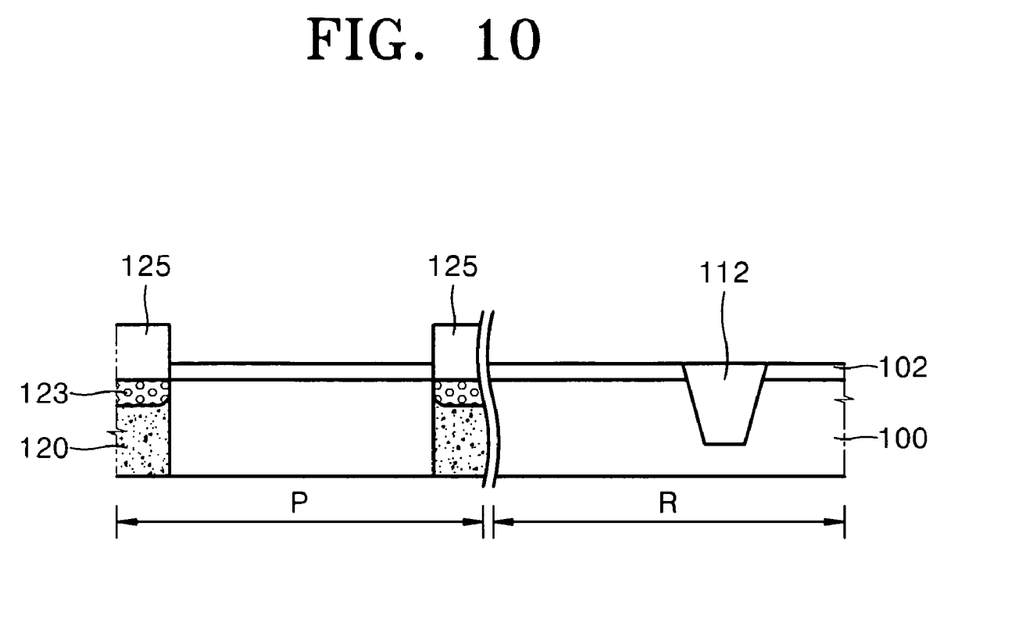

Referring to FIG. 10, the second nitride layer pattern (114a of FIG. 9) is removed using $H_3PO_4$ stripping. Therefore, the first device isolating layer 120 formed using ion implantation, and the second device isolating layer 125 that covers the first device isolating layer 120 are formed in the pixel region P of the semiconductor substrate 100. Additionally, the third device isolating layer 112 having the STI structure is formed on the peripheral circuit region R of the semiconductor substrate 100.

Figure 11:
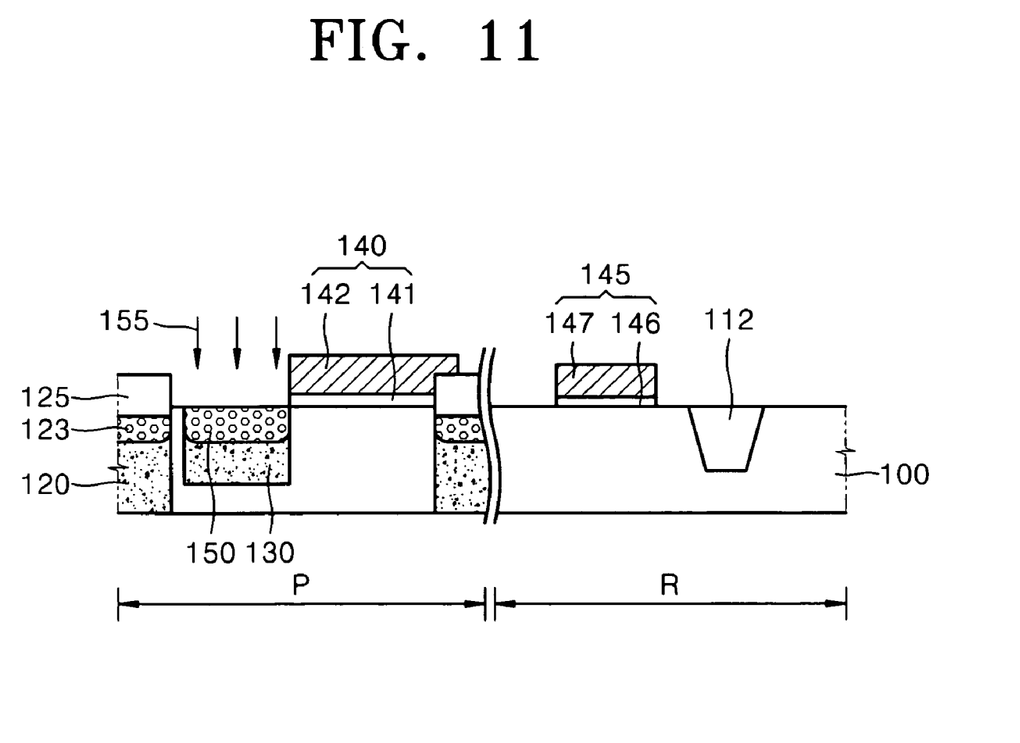

Referring to FIG. 11, an N-type impurity is ion implanted to the active region defined by the first device isolating layer 120 and the second device isolating layer 125 of the pixel region P of the semiconductor substrate 100, thereby forming the photodiode 130. For example, the N-type impurity may include, for example, arsenic (As). The transfer transistor gate 140 including the gate insulating layer pattern 141 and the gate conductive layer pattern 142 may be formed on the active region. The transfer transistor gate 140 may further include an oxide layer or a spacer along a sidewall thereof. As illustrated in FIGS. 3 and 4, the transfer transistor gate 140 may be partially overlapped with the second device isolating layer 125. Accordingly, the P-type impurity 155 such as, for example, B and $BF_2$ is implanted to the semiconductor substrate 100 exposed by the second device isolating layer 125 and the transfer transistor gate 140, thereby forming the second hole accumulation region 150. Thus, dark current produced along the surface of the semiconductor substrate 100 can be prevented by the second hole accumulation region 150.

A gate 145 including a gate insulating layer 146 and a gate conductive layer 147 similar to the transfer transistor gate 140 on the pixel region P may be formed in the active region defined by the device isolating layer 112 of the peripheral circuit region R of the semiconductor substrate 100. An oxide layer and a spacer may also be formed along a sidewall of the gate 145.

Figure 12:
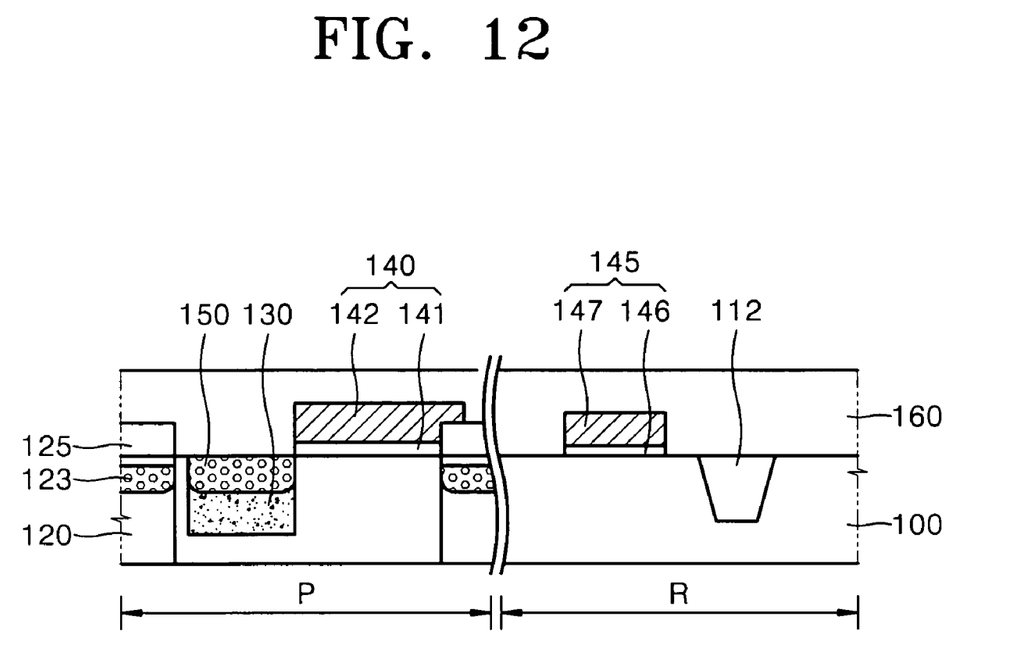

Referring to FIG. 12, an interlayer insulating layer 160 is formed on the entire surface of the resultant structure. The interlayer insulating layer 160 is composed of a material with refractivity greater than that of the second device isolating layer 125. For example, when the second device isolating layer 125 is composed of HDP oxide, the refractivity is about 1.46. Accordingly, the interlayer insulating layer 160 may be composed of SiON with a refractivity of about 1.46 or greater. The SiON layer may be formed by PE-CVD using $SiH_4$ and $N_2$ as source gas. The SiON layer formed using PE-CVD may have a refractivity of about 1.60. The refractivity may be varied according to factors such as, for example, $N_2$ content. Although in this exemplary embodiment, the second device isolating layer 125 is composed of oxide, and the interlayer insulating layer 160 is composed of SiON with a refractivity greater than that of oxide, the exemplary embodiments are not restricted thereto. Moreover, as the interlayer insulating layer 160 is composed of a material with refractivity greater than that of the second device isolating layer 125, the oblique light Y with the predetermined incident angle θ may be fully reflected when reaching the photodiode 130 after being passed through the interlayer insulating layer 160, and then concentrated on the photodiode 130.

Therefore, in accordance with exemplary embodiments of the present invention, an image sensor which prevents dark current and resulting crosstalk, which concentrates external light onto the photodiode 130, and provides improved picture quality may be obtained.

An image sensor according to exemplary embodiments of the present invention as described above includes a first device isolating layer formed by ion implanting an impurity to a pixel region, and a second device isolating layer composed of an insulating material to cover the first device isolating layer. The first device isolating layer may prevent dark current and resulting crosstalk, caused by dangling bonds or crystal defects formed on a bordering surface with the photodiode, from occurring. The image sensor includes an interlayer insulating layer composed of a material with refractivity greater than that of the material constituting the second device isolating layer on a pixel region. By doing so, when oblique light with a predetermined incident angle reaches the second device isolating layer with relatively less refractivity after passing through the interlayer insulating layer with relatively greater refractivity, the incident light is then fully reflected and then concentrated on the photodiode. Also, the image sensor further includes a first hole accumulation region on the surface of the first device isolating layer and a second hole accumulation region on the surface of the semiconductor substrate, thereby preventing dark current produced along the surface of the semiconductor substrate and resulting crosstalk from occurring.

Furthermore, the image sensor in accordance with exemplary embodiments of the present invention has different device isolating layer structures. The pixel region of the image sensor includes a device isolating layer formed using ion implantation to prevent dark current occurring in the pixel region and also to prevent resulting crosstalk. In addition, the peripheral circuit region includes a device isolating layer with a Shallow Trench Insulator (STI) structure to isolate elements of the peripheral circuit region. Consequently, the image sensor may provide improved picture quality.

Moreover, methods of manufacturing the image sensor in accordance with exemplary embodiments of the present invention may prevent dark current and resulting crosstalk from occurring, and allow oblique light to be concentrated on the photodiode. As the first hole accumulation region formed on the surface of the first device isolating layer is formed using self-alignment, problems such as mis-alignment and critical dimension deviation resulting from photolithography may also be prevented.

Additionally, methods according to exemplary embodiments of the present invention provide an image sensor with a device isolating layer of the pixel region that prevents dark current and resulting crosstalk from occurring. In addition, exemplary embodiments of the present invention also provide an image sensor, wherein the device isolating layer of the peripheral circuit region isolates elements of the image sensor.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor comprising:
   a photodiode disposed in a semiconductor substrate;
   a first device isolating layer formed having an impurity with a conductivity type in the semiconductor substrate adjacent to the photodiode;
   a second device isolating layer comprising an insulating layer that covers the first device isolating layer, wherein the photodiode comprises an impurity with a first conductivity type, and the impurity of the conductivity type of the first device isolating layer is an impurity with a second conductivity type opposite to the first conductivity type;
   an interlayer insulating layer formed on the second device isolating layer, and comprising a material with refractivity greater than that of the second device isolating layer;
   a first hole accumulation region comprising an impurity of the second conductivity type on a surface of the first device isolating layer contacting the second device isolating layer; and
   a second hole accumulation region comprising an impurity of the second conductivity type in the semiconductor substrate on the photodiode.

2. The image sensor of claim 1, wherein the impurity with the first conductivity type is an N-type impurity, and the impurity with the second conductivity type is a P-type impurity.

3. The image sensor of claim 1, wherein the second device isolating layer comprises a material selected from a group consisting of a thermal oxide, a high density plasma (HDP) oxide, or a combination of these materials.

4. The image sensor of claim 1, wherein the interlayer insulating layer comprises silicon oxynitride (SiON).

5. An image sensor comprising:
   a pixel region and a peripheral circuit region defined on a semiconductor substrate,
   wherein the pixel region comprises a first device isolating layer formed having an impurity with a conductivity type in the semiconductor substrate adjacent to a photodiode, and a second device isolating layer comprising an insulating layer that covers the first device isolating layer; the peripheral circuit region comprises a third device isolating layer having a shallow trench insulator (STI) structure; and an interlayer insulating layer formed on the pixel region and the peripheral circuit region.

6. The image sensor of claim 5, wherein the photodiode comprises an impurity with a first conductivity type, and the impurity with the conductivity type of the first device isolating layer is an impurity with a second conductivity type opposite to the first conductivity type.

7. The image sensor of claim 6, wherein the impurity with the first conductivity type is an N-type impurity, and the impurity with the second conductivity type is a P-type impurity.

8. The image sensor of claim 7, further comprising a first hole accumulation region comprising the P-type impurity in a predetermined region of the first device isolating layer contacting the second device isolating layer.

9. The image sensor of claim 8, further comprising a second hole accumulation region comprising the P-type impurity on the semiconductor substrate over the photodiode.

10. The image sensor of claim 5, wherein the second device isolating layer comprises a material selected from a group consisting of a thermal oxide, a high density plasma (HDP) oxide, or a combination of these materials.

11. The image sensor of claim 5, wherein the third device isolating layer comprises a material selected from a group consisting of a thermal oxide, a high density plasma (HDP) oxide, or a combination of these materials.

12. The image sensor of claim 5, wherein the interlayer insulating layer comprises a material with refractivity greater than that of the material forming the second device isolating layer.

13. The image sensor of claim 12, wherein the interlayer insulating layer comprises silicon oxynitride (SiON).

14. A method of manufacturing an image sensor comprising:
    forming a first mask and a second mask on a semiconductor substrate;
    ion implanting an impurity with a first conductivity type in the semiconductor substrate to form the first device isolating layer, using the second mask as an ion implantation mask;
    forming a first hole accumulation region by implanting an impurity with the first conductivity type in the first device isolating layer via self-alignment, using the second mask;
    forming the second device isolating layer to cover the first device isolating layer using the first mask;
    forming a photodiode, a plurality of gates, and an impurity implanting region on an active region defined by the first device isolating layer;
    forming a second hole accumulation region by implanting an impurity with the first conductivity type in the semiconductor substrate over the photodiode; and
    forming an interlayer insulating layer on the semiconductor substrate where the photodiode, the plurality of gates, and the impurity implanting region are formed, and wherein the photodiode is formed having an impurity with a second conductivity type opposite to the impurity with the first conductivity type constituting the first device isolating layer.

15. The method of claim 14, wherein the impurity with the first conductivity type is a P-type impurity and the impurity with the second conductivity type is an N-type impurity.

16. The method of claim 14, wherein the forming of the second device isolating layer comprises:
    removing the second mask;
    forming a material constituting the second device isolating layer on substantially the entire surface of the resultant structure;
    planarizing the resultant structure; and
    removing the first mask to form the second device isolating layer that covers the first device isolating, layer.

17. The method of claim 14, wherein the second device isolating layer comprises a material selected from a group consisting of a thermal oxide layer, a high density plasma (HDP) oxide layer or a combination of these layers.

18. The method of claim 14, wherein, the interlayer insulating layer comprises a material with refractivity greater than that of the material constituting the second device isolating layer.

19. The method of claim 18, wherein, the interlayer insulating layer comprises silicon oxynitride (SiON).

20. A method of manufacturing an image sensor comprising:
- ion implanting an impurity in a pixel region of a semiconductor substrate to form a first device isolating layer, using an ion implantation mask;
- forming a second device isolating layer that covers the first device isolating layer, using a hard mask;
- forming a trench in a peripheral circuit region of the semiconductor substrate;
- forming a third device isolating layer of the peripheral circuit region by filling the trench with an insulating layer; and
- forming an interlayer insulating layer on the pixel region and the peripheral circuit region after forming the third device isolating layer.

21. The method of claim 20, further comprising forming a photodiode in the semiconductor substrate with a first conductivity type and wherein, an impurity with a second conductivity type opposite to that of the impurity constituting the photodiode of the image sensor is ion implanted to form the first device isolating layer.

22. The method of claim 20, wherein the interlayer insulating layer comprises a material with refractivity greater than that of a material constituting the second device isolating layer.

* * * * *